(12) United States Patent
Gottwald et al.

(10) Patent No.: US 10,555,419 B2
(45) Date of Patent: Feb. 4, 2020

(54) CONDUCTOR-STRUCTURE ELEMENT HAVING AN INTERNAL LAYER SUBSTRATE LAMINATED INTO SAME, AND METHOD FOR THE PRODUCTION THEREOF

(71) Applicant: Schweizer Electronic AG, Schramberg (DE)

(72) Inventors: Thomas Gottwald, Dunningen (DE); Christian Rössle, St. Georgen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 133 days.

(21) Appl. No.: 15/748,100

(22) PCT Filed: Aug. 10, 2016

(86) PCT No.: PCT/EP2016/069016
§ 371 (c)(1),
(2) Date: Jan. 26, 2018

(87) PCT Pub. No.: WO2017/025552
PCT Pub. Date: Feb. 16, 2017

(65) Prior Publication Data
US 2018/0242456 A1    Aug. 23, 2018

(30) Foreign Application Priority Data

Aug. 12, 2015  (DE) .................. 10 2015 113 324

(51) Int. Cl.
*H05K 1/18* (2006.01)
*H05K 1/02* (2006.01)
(Continued)

(52) U.S. Cl.
CPC ............. *H05K 1/186* (2013.01); *H01Q 1/38* (2013.01); *H05K 1/024* (2013.01); *H05K 1/0243* (2013.01);
(Continued)

(58) Field of Classification Search
CPC ...... H05K 1/0243; H05K 1/186; H05K 1/185; H05K 3/4614; H05K 1/181; H05K 1/115;
(Continued)

(56) References Cited

U.S. PATENT DOCUMENTS 6,770,955 B1 *  8/2004  Coccioli ............. H01L 23/3128
                                                          257/659
2002/0192442 A1  12/2002  Kondo et al.
(Continued)

FOREIGN PATENT DOCUMENTS

DE  10 2005 032 489   7/2005
DE  10 2012 013 920   7/2012
(Continued)

OTHER PUBLICATIONS

The International Bureau of WIPO, International Search Report on Patentability, dated Dec. 16, 2016, PCT/EP2016/069016.
(Continued)

*Primary Examiner* — Hai V Tran
(74) *Attorney, Agent, or Firm* — Shlesinger, Arkwright & Garvey LLP

(57) ABSTRACT

Method for producing a conductor structural element with a layer sequence having an internal layer substrate, including the steps: providing a rigid carrier having an underside and a top side; defining a cut-out section on the rigid carrier; applying at least one electrically insulating layer with a recess in such a way that the cut-out section is exposed; placing an internal layer substrate above the cut-out section with formation of a cavity between the rigid carrier and the internal layer substrate; aligning and fixing the internal layer substrate relative to the rigid carrier; laminating the layer construction prepared in this manner such that resin material of the at least one electrically insulating layer liquefies and encloses the internal layer substrate with the cavity being
(Continued)

left free; producing a cut-out by cutting the cut-out section out of the rigid carrier from the outer underside of the rigid carrier.

26 Claims, 11 Drawing Sheets

(51) Int. Cl.
  *H02K 3/46* (2006.01)
  *H05K 3/46* (2006.01)
  *H01Q 1/38* (2006.01)
  *H05K 1/11* (2006.01)

(52) U.S. Cl.
  CPC .............. *H05K 1/115* (2013.01); *H05K 1/181* (2013.01); *H05K 1/185* (2013.01); *H05K 3/4614* (2013.01); *H05K 3/4694* (2013.01); *H05K 3/4697* (2013.01); *H05K 3/462* (2013.01); *H05K 3/4617* (2013.01); *H05K 2201/015* (2013.01); *H05K 2201/09127* (2013.01); *H05K 2201/09509* (2013.01); *H05K 2201/09936* (2013.01); *H05K 2201/10098* (2013.01); *H05K 2201/10378* (2013.01); *H05K 2203/0285* (2013.01); *H05K 2203/063* (2013.01); *H05K 2203/166* (2013.01)

(58) Field of Classification Search
  CPC ...... H05K 1/024; H05K 3/4697; H05K 3/462; H05K 1/18; H05K 1/02; H05K 3/46; H01Q 9/0407; H01Q 1/38; H01L 23/552
  USPC .................................................. 343/700 MS
  See application file for complete search history.

(56) References Cited

U.S. PATENT DOCUMENTS

| 2005/0109532 | A1 | 5/2005 | Hermkens et al. |
|---|---|---|---|
| 2008/0253085 | A1 | 10/2008 | Aviv Softer |
| 2008/0297400 | A1 | 12/2008 | Hansen et al. |
| 2010/0170703 | A1 | 7/2010 | Iihola et al. |
| 2012/0217049 | A1 | 8/2012 | Hanai et al. |
| 2013/0020120 | A1 | 1/2013 | Ishihara et al. |
| 2013/0199829 | A1* | 8/2013 | Gottwald ............ G01L 19/0645 174/258 |
| 2013/0258626 | A1* | 10/2013 | Wavering ............ H05K 1/0265 361/775 |
| 2014/0209366 | A1 | 7/2014 | Kubota et al. |
| 2015/0223342 | A1 | 8/2015 | Kwon et al. |
| 2016/0007480 | A1 | 1/2016 | Yosui |
| 2016/0014901 | A1* | 1/2016 | Gottwald ............. H01L 23/142 361/767 |
| 2016/0029489 | A1 | 1/2016 | Wakabayashi et al. |

FOREIGN PATENT DOCUMENTS

| EP | 0195935 | 2/1986 |
|---|---|---|
| WO | WO 2011/099820 | 8/2011 |
| WO | WO 2014/100848 | 7/2014 |
| WO | WO 2014/185438 | 11/2014 |
| WO | WO 2015/056517 | 4/2015 |

OTHER PUBLICATIONS

Craig Freudenrich, Ph.D,"How Ultrasonic Welding Works", XP-002764119, Nov. 16, 2016.

D. Orban and G.J.K. Moernaut, Orban Microwave Products,"The Basics of Path Antennas", XP-002764118, RF Globalnet, Sep. 29, 2009.

German Patent Office, Search Report, Priority Application DE10 2015 113 324.5, dated Jul. 22, 2016.

International Bureau of WIPO, International Preliminary Report on Patentability, PCT/EP2016/069016, dated Feb. 22, 2018.

* cited by examiner

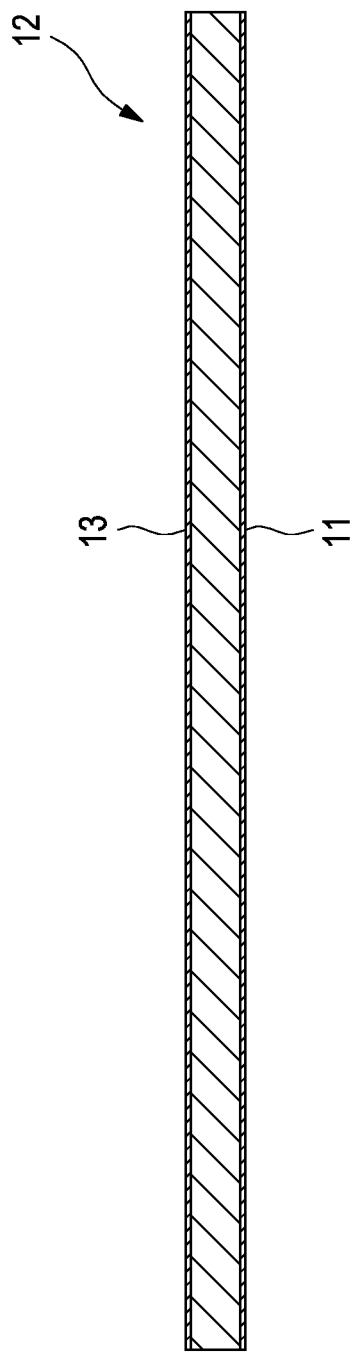
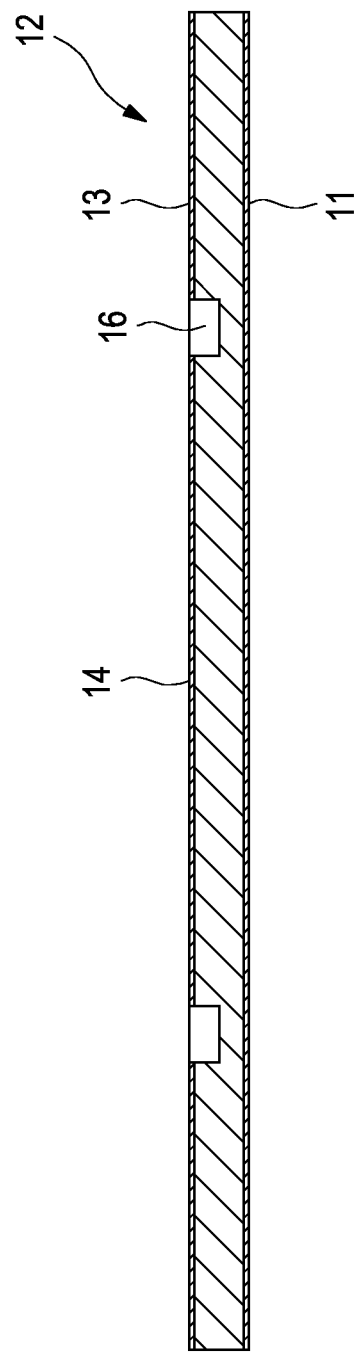

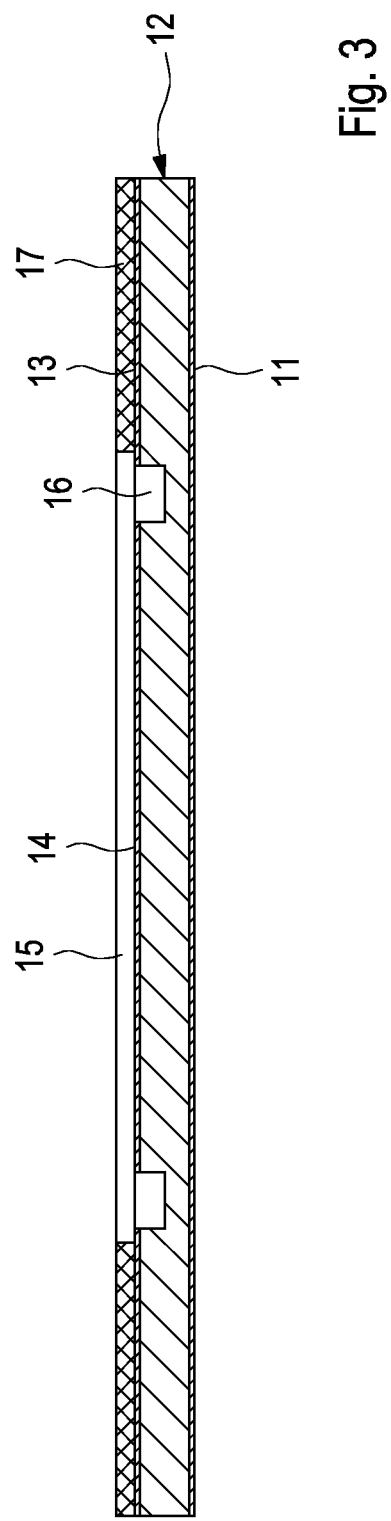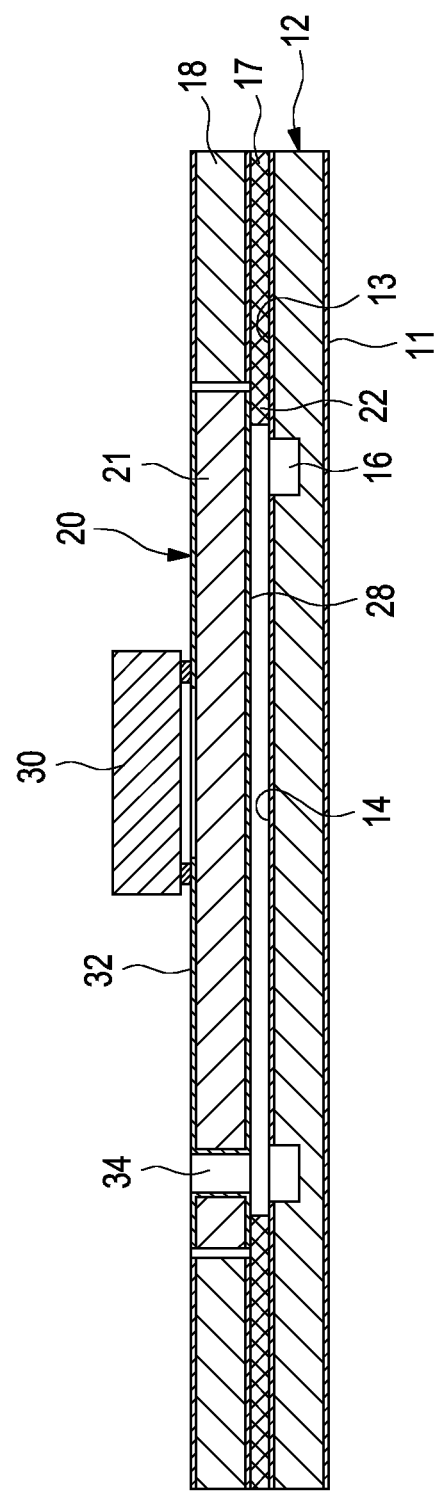

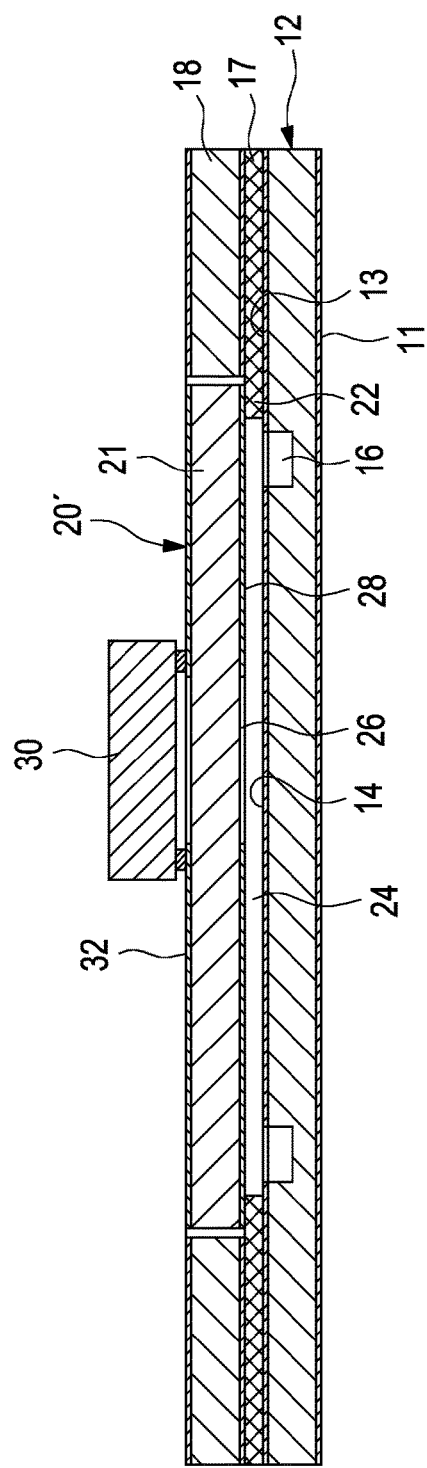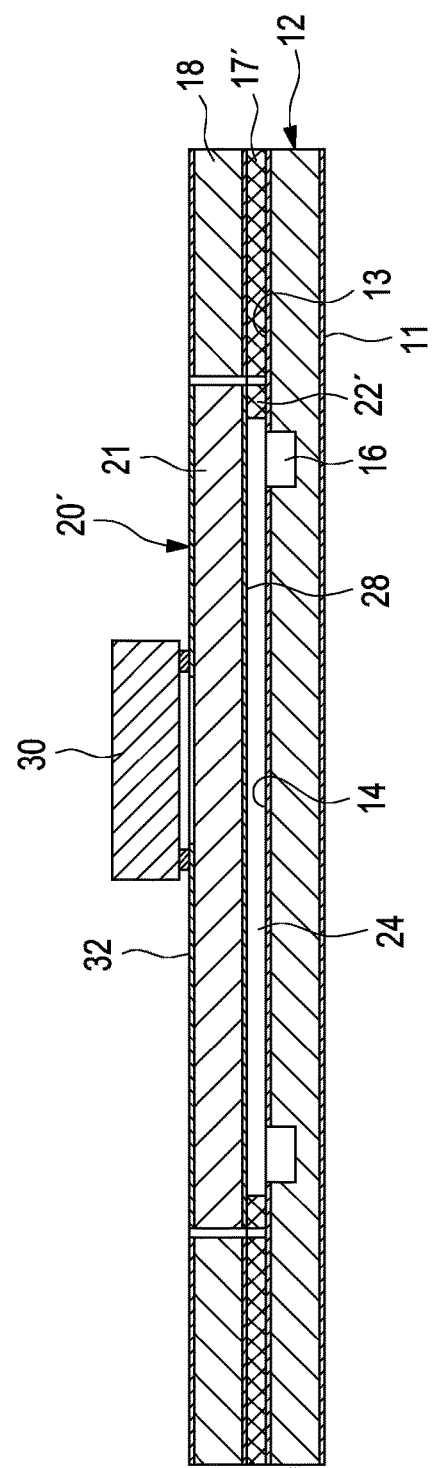

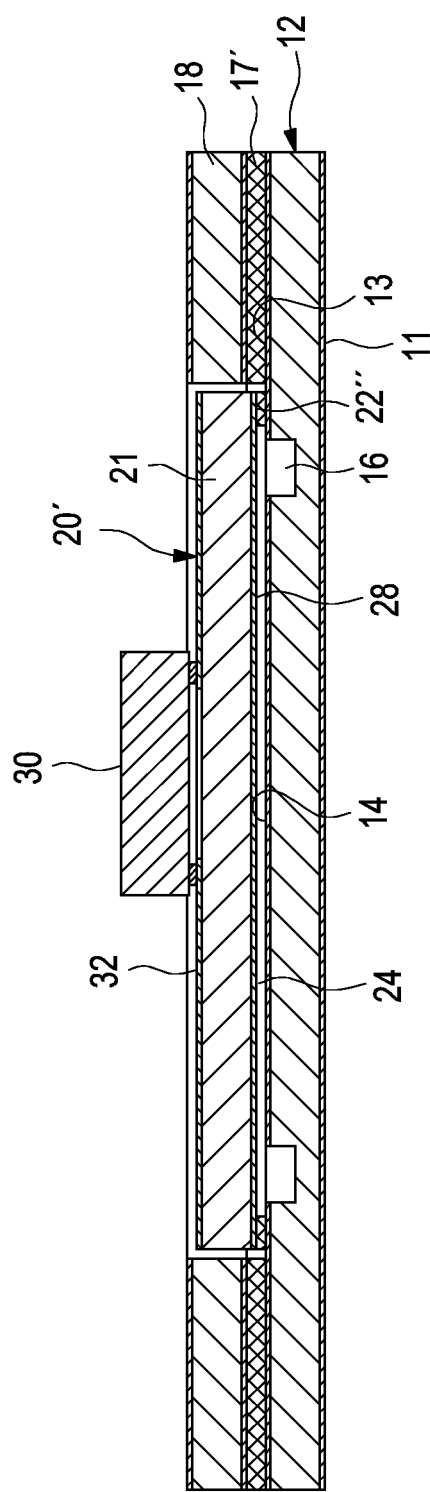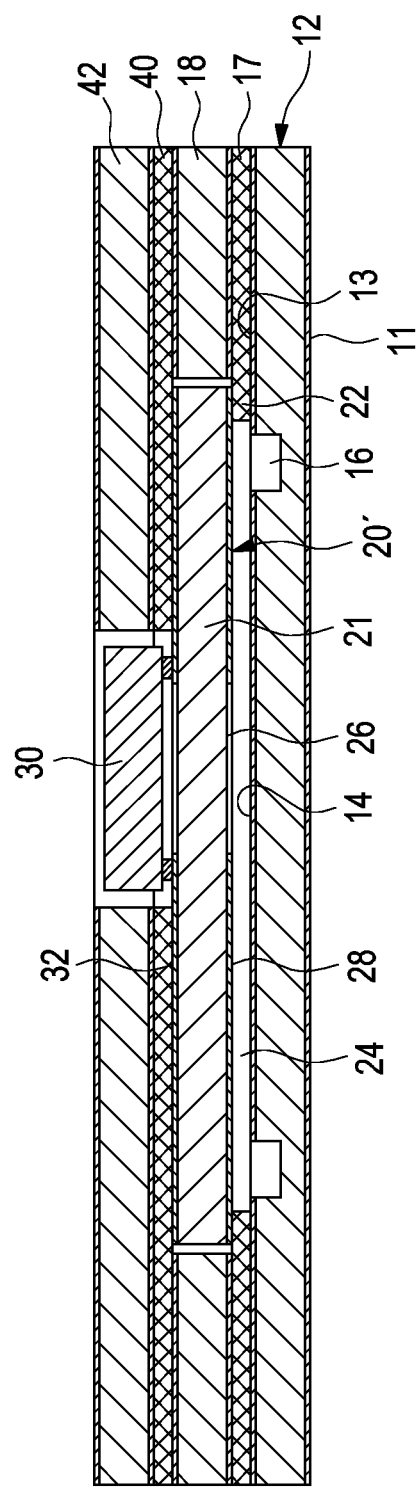

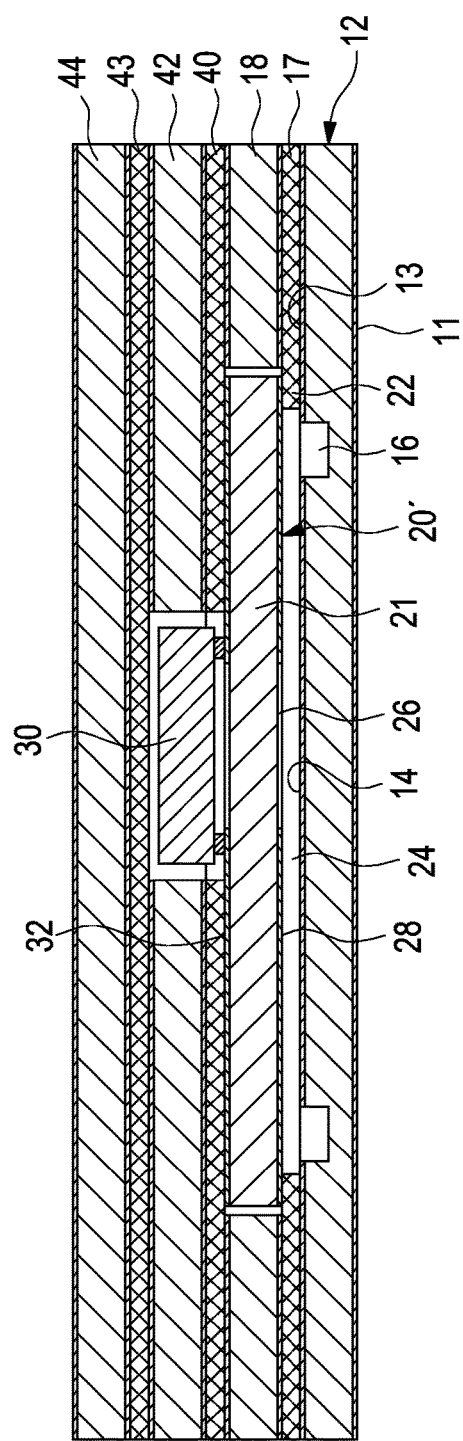
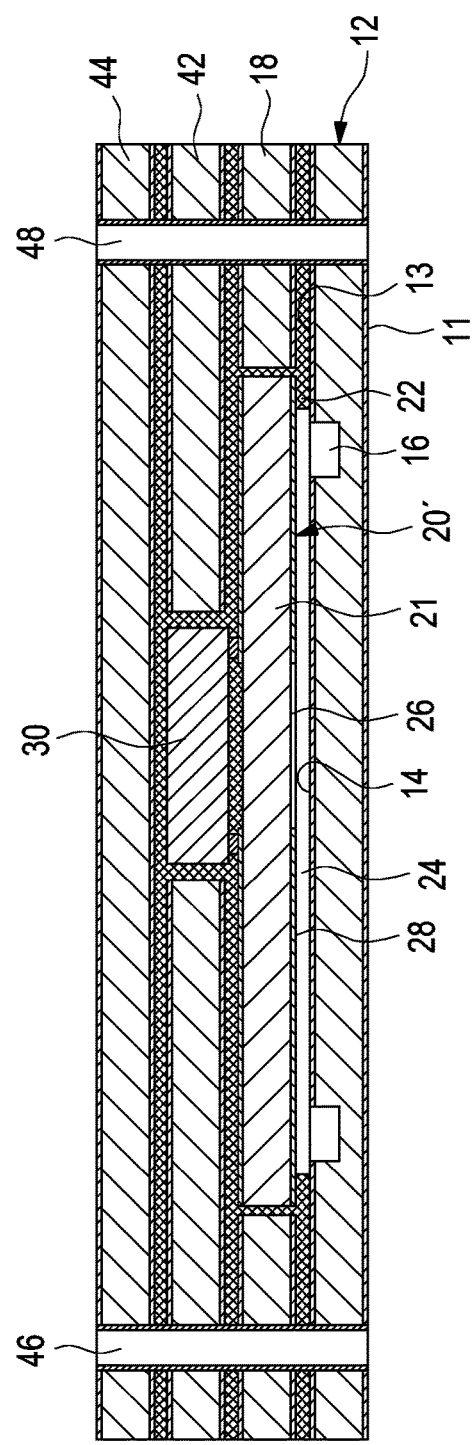
Fig. 9
Fig. 10

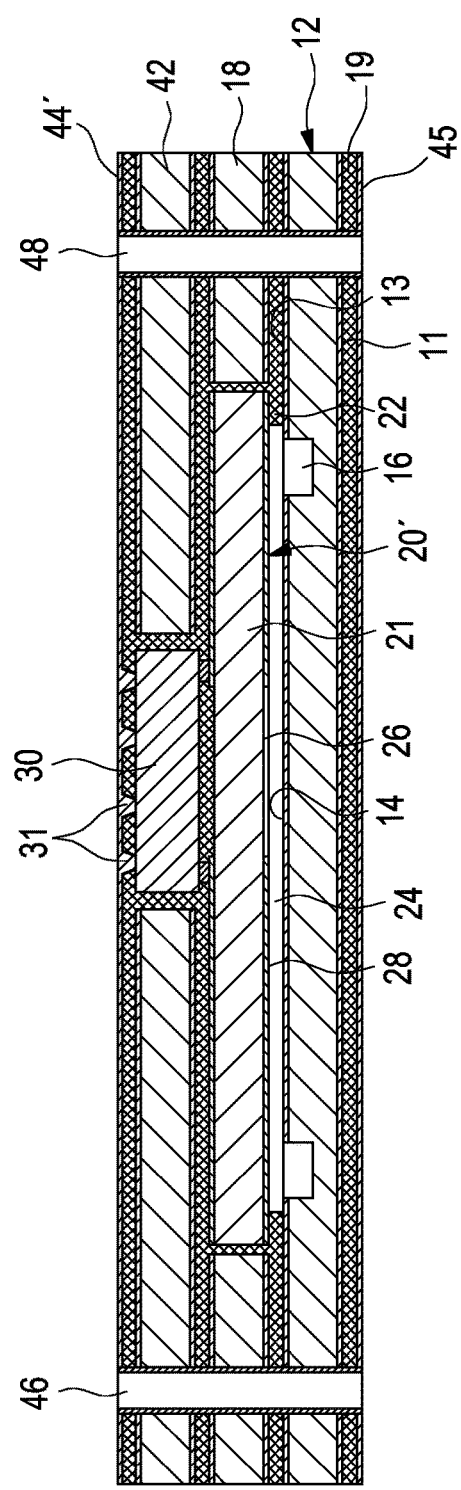
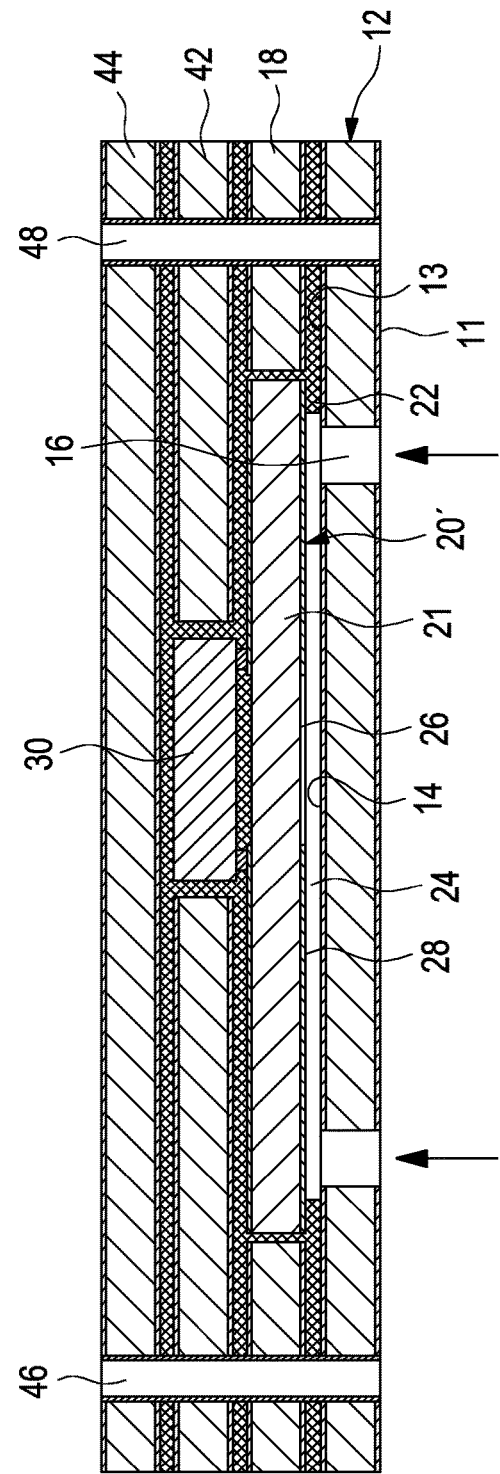

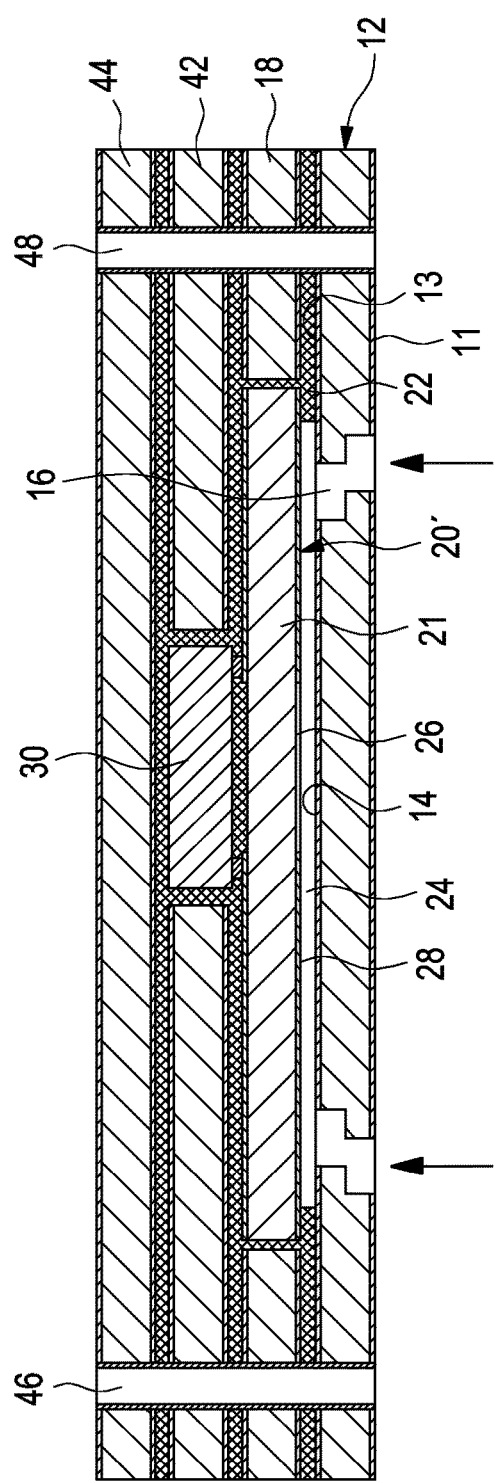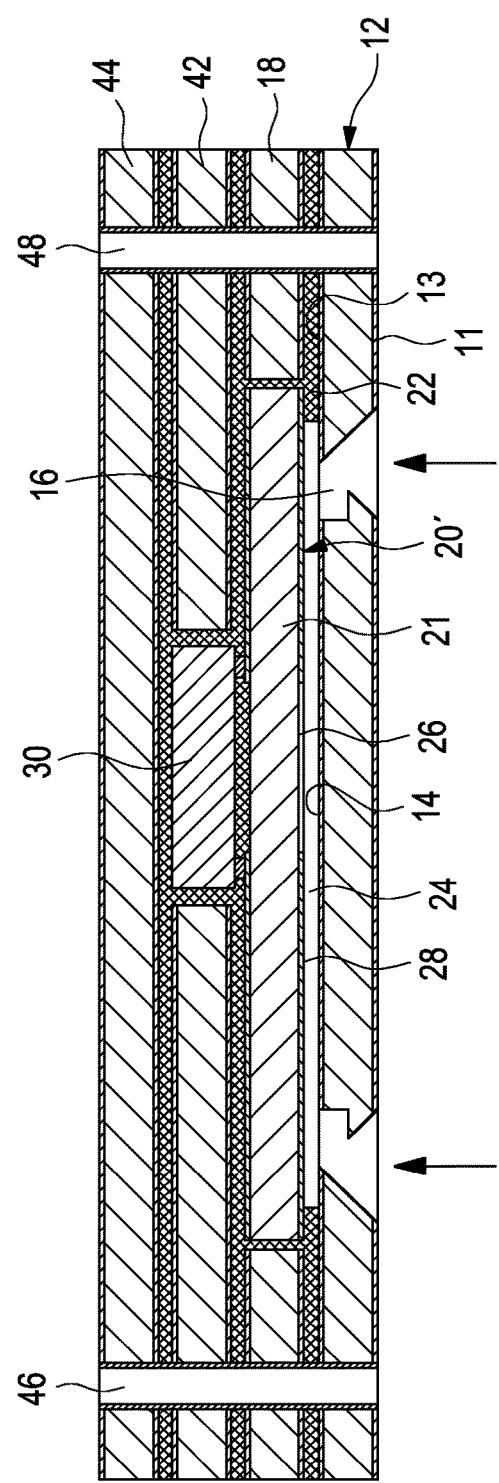

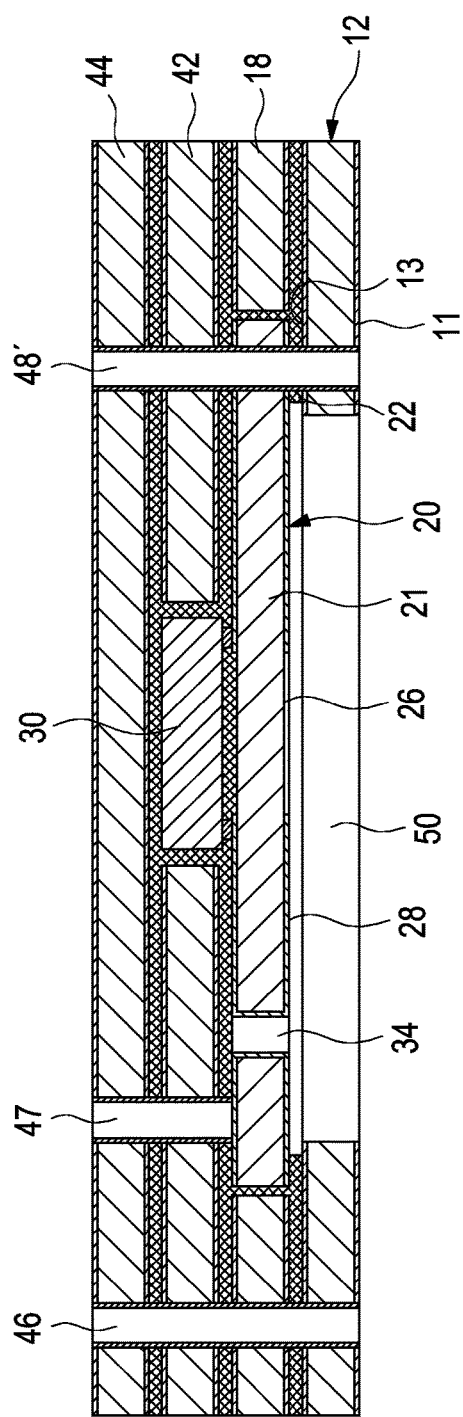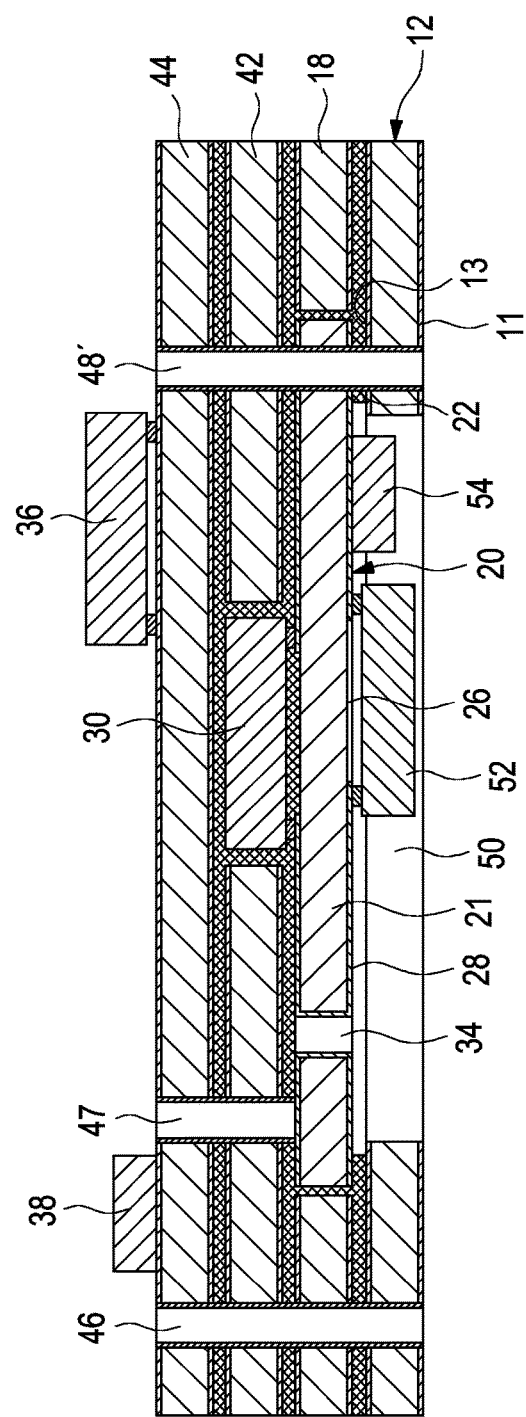

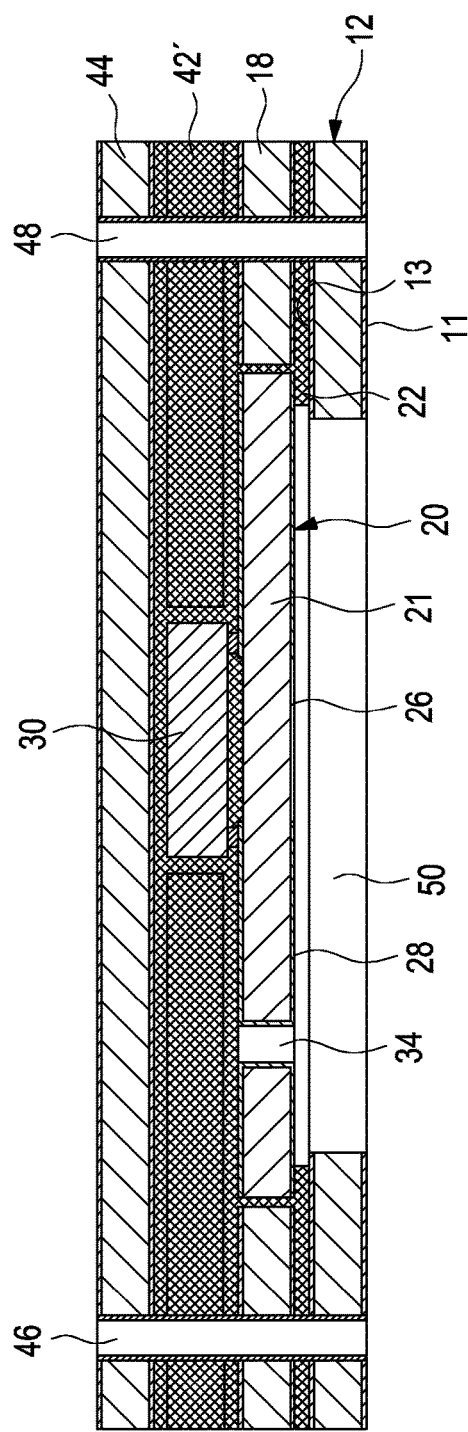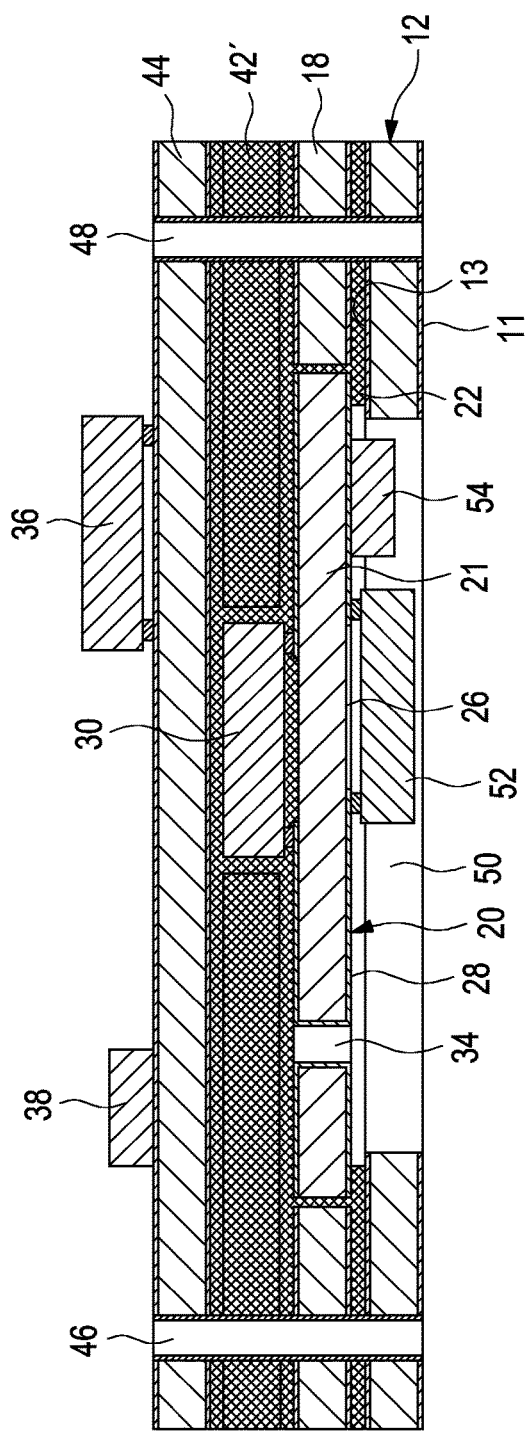

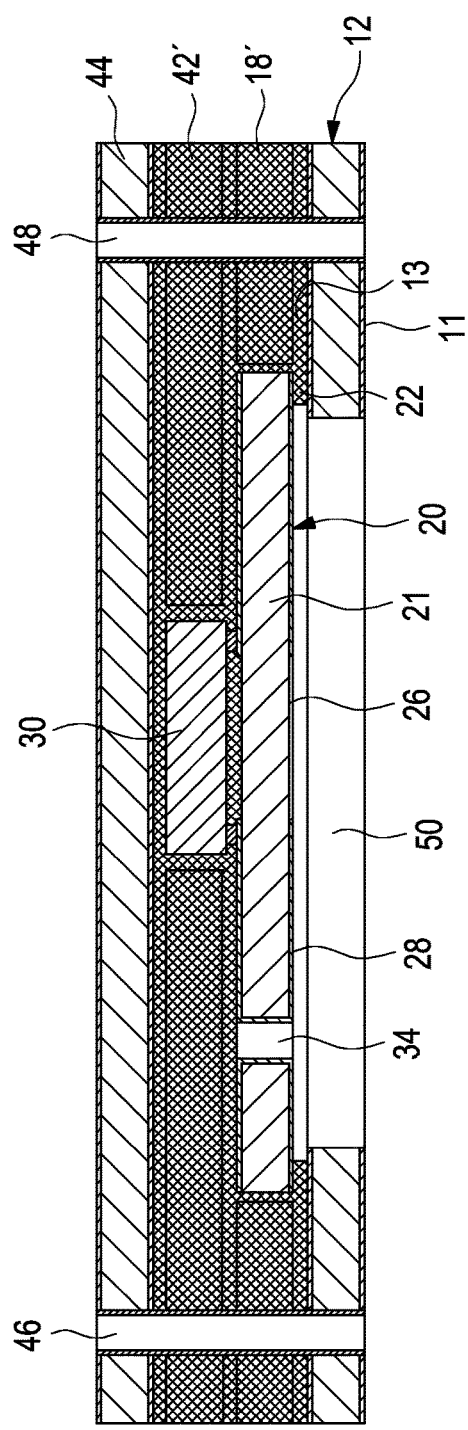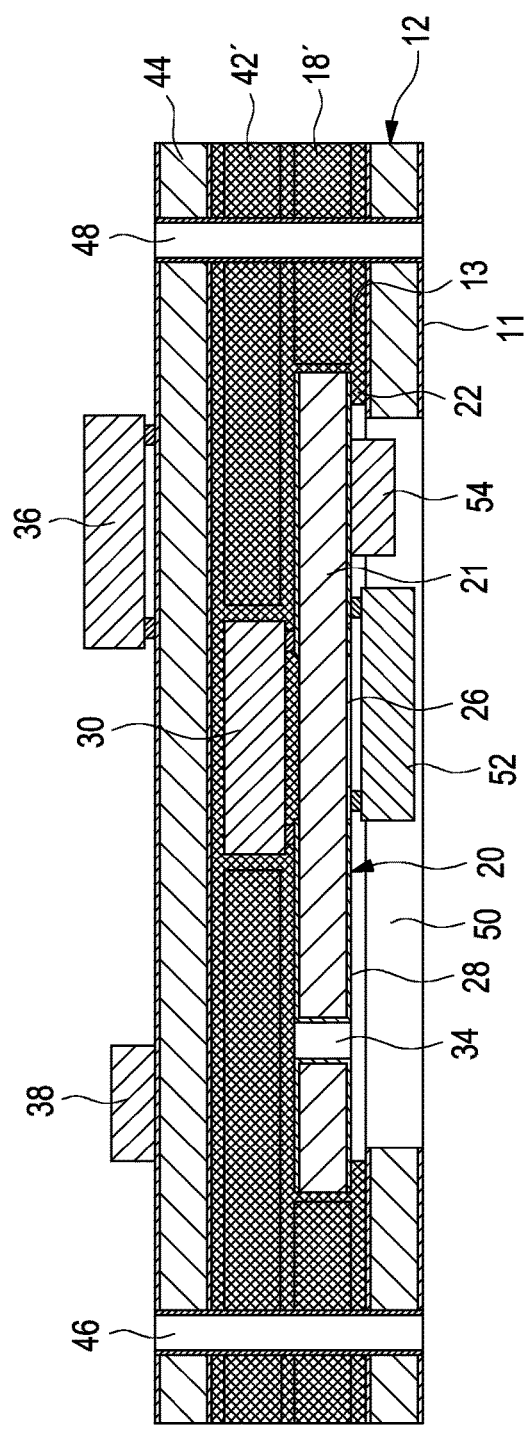
Fig. 14
Fig. 14 a

CONDUCTOR-STRUCTURE ELEMENT HAVING AN INTERNAL LAYER SUBSTRATE LAMINATED INTO SAME, AND METHOD FOR THE PRODUCTION THEREOF

RELATED APPLICATIONS

This is a national stage of International PCT Application No. PCT/EP2016/069016, filed Aug. 10, 2016, which claims the priority benefit of Germany 10 2015 113324.5, filed Aug. 12, 2015, both of which are hereby incorporated by reference.

TECHNICAL FIELD

The present invention relates to a method for producing a conductor structural element and a conductor structural element produced according to the method having an internal layer substrate laminated into a layer construction.

DESCRIPTION OF THE PRIOR ART

Conductor structural elements having internal layer substrates laminated into a layer construction and methods for the production thereof are known, e.g. from WO 2010/078611 A1, which discloses a printed circuit board element having a plurality of dielectric layers and conductor layers, which furthermore comprises at least one dedicated laser beam stopping element different than the conductor layers within the printed circuit board element in order to prevent a laser beam used for drilling or cutting from penetrating deeply into the printed circuit board element, wherein the laser beam stopping element is formed with particles that absorb and/or reflect laser beam energy.

SUMMARY OF THE INVENTION

Against this background, the invention proposes a method for producing a conductor structural element having the features of claim 1 and also a conductor structural element with an internal layer substrate laminated into a layer construction having the features of claim 22 or 23.

The concept of the invention provides for introducing in the layer construction of a conductor structural element an internal layer substrate, and for cutting a cut-out section out of the outer layer of the carrier substrate after laminating and processing the layer construction. This enables uncomplicated handling and processing of the layer construction during and after laminating since the sensitive internal layer substrate is initially completely embedded. A cavity is provided between the internal layer substrate and the carrier substrate, said cavity facilitating the cutting-out of the cut-out section. The formation of the cavity can be achieved by means of a flow barrier that prevents liquefied resin material from flowing into the region of the cut-out section during laminating. The flow barrier can also serve as a support element for the internal layer substrate.

The invention opens up the possibility of subsequently populating with further components that region of the internal layer substrate which is assigned to the cut-out section or cut-out of the carrier substrate (cavity population), and thus of achieving a very thin, compact layer construction, which is useful e.g. in stack applications. Conductor structural elements produced according to the invention are distinguished by the possibility of a high logic density, besides a small thickness.

The invention also opens up the possibility of realizing cost-effective radio-frequency applications and radar circuits for the motor vehicle sector. The dimensions and the design of the layer substrate and the position of the cut-out section are then chosen such that an antenna structure formed on the internal layer substrate is assigned to the cut-out section in such a way as to enable a largely unimpeded emission and/or reception of RF waves when the cut-out section has been cut out.

The antenna structure can be formed either on the side of the internal layer substrate facing the cut-out cut-out section or on the side facing away from it.

Further advantages and configurations of the invention are evident from the description and the accompanying drawing.

It goes without saying that the features mentioned above and those yet to be explained below can be used not only in the combination respectively indicated, but also in other combinations or by themselves without departing from the scope of the present invention.

The invention is illustrated schematically on the basis of an exemplary embodiment in the drawing and is described thoroughly below with reference to the drawing.

BRIEF DESCRIPTION OF THE DRAWING

FIGS. 1 to 12 illustrate the production process according to the invention for a conductor structural element according to the invention, wherein FIG. 1 shows a carrier substrate in side view, FIG. 2 shows the carrier substrate from FIG. 1 with an introduced depression, FIG. 3 shows the carrier substrate from FIG. 2 with an applied electrically insulating layer, FIG. 4 shows the carrier substrate from FIG. 3 with an applied internal layer substrate, FIG. 5 shows the layer construction from FIG. 4 with an alternative configuration of the internal layer substrate, FIG. 6 shows the layer construction from FIG. 5 with an alternative configuration of the support element, FIG. 7 shows the layer construction from FIG. 5 with a further alternative configuration of the support element, FIGS. 8 and 9 show the layer construction from FIG. 5 with further applied layers before laminating, FIG. 10 shows the layer construction from FIG. 9 after laminating, FIG. 10*a* shows an alternative embodiment of the layer construction from FIG. 10, FIG. 11 shows the layer construction from FIG. 10 in the course of cutting out the cut-out section with a straight aligned cut, FIG. 11*a* shows the layer construction from FIG. 10 in the course of cutting out the cut-out section with a straight offset cut, FIG. 11*b* shows the layer construction from FIG. 10 in the course of cutting out the cut-out section with an oblique offset cut, and FIG. 12 shows the layer construction from FIG. 10 with a straight cut-out section having been cut out.

FIGS. 13 and 14 show variants of the conductor structural element from FIG. 12.

FIGS. 12*a*, 13*a* and 14*a* shows variants of FIGS. 12, 13 and 14 with further components populated through the cut-out section that has been cut out.

DETAILED DESCRIPTION

Figure 15:
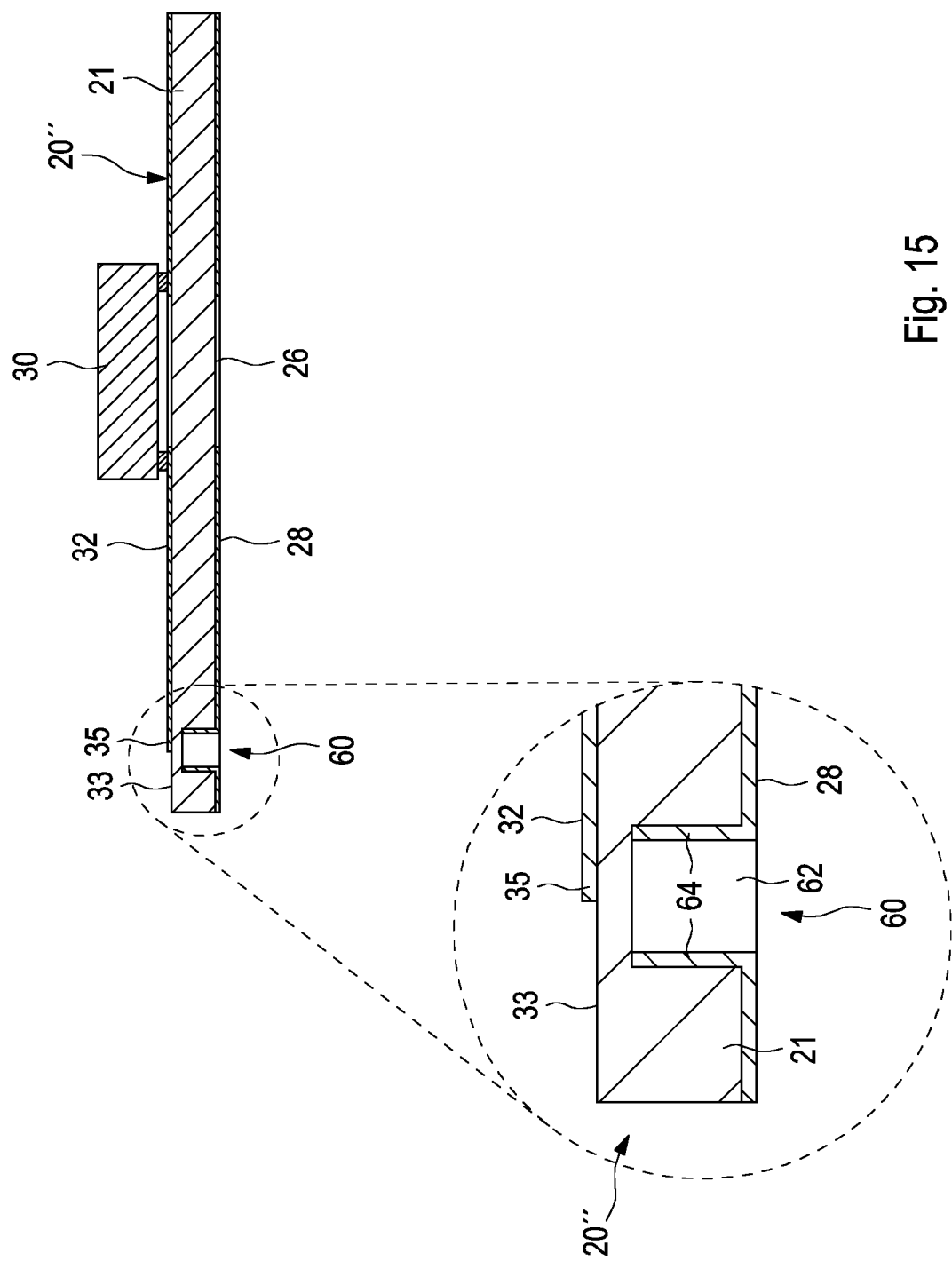
FIG. 15 shows a waveguide coupling of a variant with the radio-frequency substrate in a lateral excerpt illustration.

In accordance with the method according to the invention, firstly a rigid carrier 12 is provided as base material (FIG. 1).

The rigid carrier 12 can be e.g. a copper plate or a copper-coated plate (e.g. a copper-clad standard inner layer). The rigid carrier 12 has an underside 11 and a top side 13.

In a next step, a circumferential depression 16 is introduced in the rigid carrier 12 on the top side 13 thereof, said depression defining a cut-out section 14. The depression 16 can be introduced e.g. by means of deep milling or some other suitable method.

Afterward—once again on the top side 13 of the carrier 12—a layer 17 composed of an electrically insulating material is applied, which material can be e.g. a so-called prepreg material (cf. FIG. 3). The electrically insulating layer 17 has a recess 15 and is applied in such a way that both the circumferential depression 16 and the cut-out section 14 defined by the circumferential depression 16 are exposed or open.

An internal layer substrate 20 is applied on the electrically insulating layer 17 and above the recess 15 thereof (cf. FIG. 4). This can involve an interposer populated with a component (chip) 30—as in the illustration in FIG. 4.

As is evident from the illustration in FIG. 4, the internal layer substrate 20 is arranged above the exposed cut-out section 14. The internal layer substrate 20 has a top side 32 and an underside 28, which are each provided with a copper coating (it is readily apparent to the person skilled in the art that a Cu coating just on one side is also possible).

The internal layer substrate 20 in FIG. 4 comprises a (closed) plated-through hole 34 and also a blind hole (blind laser via) 35, and FIG. 5 illustrates an embodiment with an internal layer substrate 20' without a through hole.

The arrangement of the internal layer substrate at a distance above the cut-out section 14 is achieved by means of a support element. In the exemplary embodiment in FIGS. 4 and 5, the dimensions of the electrically insulating layer 17, of the circumferential depression 16 and of the internal layer substrate 20 are chosen in such a way that the electrically insulating layer 17 circumferentially "frames" the circumferential depression 16 and a section of the electrically insulating layer 17 that adjoins the circumferential depression 16 serves as a support element 22 for the internal layer substrate 20 extending across the circumferential depression 16 in terms of its dimensions.

In the case of a radio-frequency application, the internal layer substrate 20 comprises a radio-frequency-suitable base material 21, and the reference sign 26 denotes a location at the underside 28 of the substrate 20 at which the copper coating is removed (e.g. etched away) in order to form an antenna structure (c.f. FIG. 5). The antenna structure typically involves so-called patch antennas such as are known per se to the person skilled in the art from the prior art. The antenna structure 26 formed (in this exemplary embodiment) at the underside 28 of the internal layer substrate 20 (i.e. the side facing the rigid carrier with the internal layer substrate having been introduced) is thus located above the cut-out section and at a distance therefrom.

The base material 21 of the substrate 20 can be e.g. polytetrafluoroethylene (PTFE) or PTFE-based laminates (such as e.g. Rogers® 3003), but also other radio-frequency-suitable or radio-frequency-transmissive materials (i.e. materials which allow penetration of radio-frequency beams with lower signal damping than is the case with conventional materials) are also possible.

With further reference to FIG. 4, in the case of a radio-frequency application, a possibility of electrical connection between the antenna structure 26 on the underside 28 of the interposer or internal layer substrate 20 and the top side 32 and thus the chip 30 is opened up via the through hole 34.

In principle, there are also other coupling possibilities known per se to the person skilled in the art such as e.g. a waveguide coupling, as will be described below by way of example with reference to FIG. 15.

In accordance with a further exemplary embodiment illustrated in FIG. 6, the support element 22' can be formed separately from the electrically insulating layer 17'. The latter is then arranged at a greater distance from the circumferential depression 16, such that between the electrically insulating layer 17' and the circumferential depression 16 there is enough space for the arrangement of the support element 22'. The support element 22' extends circumferentially around the circumferential depression 16 and preferably has the same geometric shape (circular, oval, rectangular, etc.); it surrounds the circumferential depression 16 in a ring-shaped manner (ring-shaped in the sense of a circumferentially closed structure, which is not necessarily circular).

In the embodiment variant illustrated in FIG. 6, the support element 22' is e.g. a ring-shaped arrangement of a rapidly curing adhesive, such as e.g. an epoxy resin adhesive.

FIG. 7 shows a further exemplary embodiment for fitting the internal layer substrate 20' above the cut-out section 14, wherein the support element 22" for placing the internal layer substrate 20' and for achieving a spacing with respect to the cut-out section 14 is formed by coated contact areas, e.g. by a nickel-gold coating, on which the internal layer substrate 20 can be fitted by means of an ultrasonic friction welding method. In this way, as is evident from the illustration in FIG. 7, a smaller distance from the rigid carrier 12 can be realized. This is discernible in the illustration in FIG. 7 by virtue of the fact that the surface 32 of the internal layer substrate 20' is not at the same level as the surface of a surrounding layer 18.

Materials other than the Ni—Au coating described, which materials are suitable for carrying out an ultrasonic friction welding method, can also be used as a support element. The surface of the rigid carrier can likewise have a corresponding coating of suitable material at the locations bearing the support element. The support element can be formed separately; however, it can also be formed at the rigid carrier and/or the internal layer substrate to be placed.

The support element 22, 22', 22" is accorded a dual function: firstly, it serves for applying the substrate 20, 20' on the carrier 12 in a spaced-apart manner and then fixing it in its position in order to enable a further precise layer construction (next e.g. the surrounding layer 18 already discussed). Furthermore, the support element 22, 22', 22" serves as a flow barrier or obstacle in order to prevent the spreading of liquefied resin into the region of the cut-out section 14 in the subsequent step of laminating, as will be described in even greater detail below.

The step of fixing the substrate 20, 20' will be carried out e.g. by means of a targeted heating of the edge region of the substrate 20, 20' above the support element 22, 22', 22". In the exemplary embodiments in FIGS. 4, 5 and 6, the region serving as a support element is firstly liquefied, and then hardened. As a result of the heating, that region of the prepreg layer 17 which serves as a support element 22 is liquefied in the case of the exemplary embodiment in FIGS. 4 and 5 and the adhesive serving as a support element 22' is liquefied in the case of the exemplary embodiment in FIG. 6 in order subsequently to harden to form a fixed connection in both cases. In addition, pressure can be applied to the edge region of the substrate 20, 20'. In the case of the exemplary embodiment in FIG. 7, the edge region of the substrate 20, 20' is subjected to an ultrasonic friction welding method.

After the step of fixing, a further layer 18 laterally surrounding the internal layer substrate 20, 20' is placed (this layer can be dispensed with, if appropriate, in the case of thin substrates). It goes without saying that this layer can also already be applied before the step of fixing; however, it is appropriate to place the layer only after the fixing step in order to enable the fixing to be carried out without spatial impairment by the additional layer.

Finally, the layer construction is completed by the application of further partial layers 40, 42 (which have cutouts for receiving the chip 30) and whole-area inner layers 43, 44 (cf. FIGS. 8 and 9). Said layers are as required electrically insulating layers (such as e.g. the layers 40 and 43) and/or electrically conductive layers (such as e.g. the layers 42 and 44).

The layer construction is then laminated (cf. FIG. 10), whereby the cavities are filled in a gap-free manner as a result of liquefaction of the prepreg material of the electrically insulating layers (the layers bearing the reference signs 17, 40, 43 in the exemplary embodiment illustrated). This gap-free filling of the cavities with the resin material of the electrically insulating layers which is melted during laminating ends—as already mentioned above—according to the invention at the circumferential support element 22, 22', 22", that is to say that a gap-free filling of all cavities apart from the region above the defined cut-out section 14 takes place.

According to the invention, the circumferential support element 22, 22', 22" serves as a flow barrier, with the consequence that the cut-out section 14 and the spacing situated thereabove with respect to the internal layer substrate 20, 20' are not filled, with the result that a cavity 24 is formed between the cut-out section 14 and the internal layer substrate 20, 20'.

A cavity within the meaning of the present invention should be understood to be a region or a space which is formed by the underside 28 of the RF substrate 20, the top side 13 of the rigid carrier 12 and the circumferential support element 22, 22', 22" and which is distinguished by the fact that it is kept free of the ingress of liquid resin during laminating. The consequence is that the two layers—lying one above the other—of the rigid carrier 12 and of the RF substrate 20 in the region of the cavity 24 do not become connected (that is to say are not adhesively bonded by resin or connected to one another in some other way); the two layers merely lie one above the other. This does not preclude the two layers touching one another, which may be the case on account of the small height of the intermediate layer 17 and the support element 22, 22', 22" in particular after the layer construction has been laminated.

The intermediate product of a multilayer construction that is produced in this way according to the invention constitutes a closed arrangement which allows further handling or processing without impairment of the enclosed interposer with radio-frequency antenna. By way of example, it is now possible without having to show particular consideration for the interposer or the substrate 20, 20'—to introduce through holes 46, 48 through the layer construction and then to subject them to a (wet-chemical) electroplating process for coating their surfaces with Cu (cf. FIG. 10).

FIG. 10a shows an embodiment of the invention in which, instead of the upper electrically conductive whole-area inner layer 44 of the variant in FIG. 10 (which as it were forms a "cover"), a copper film 44' is provided as an upper terminating layer. The chip 30 is contact-connected to the copper film 44' by means of copper-filled blind holes 31. This embodiment is suitable in particular for linking to a heat sink (not illustrated) with the layer of the copper film 44' in order thus to achieve an improved dissipation of the heat produced (the linking of the component to a copper surface results in an improved heat spreading and thus in lower maximum temperatures). Drilling holes through the copper film and filling them with copper or some other conductive material proves to be simpler compared with the use of a laminate ("cover" 44). With the "cover", a rear-side contact connection is difficult, if not impossible. For reasons of symmetry—as is illustrated in FIG. 10a—a copper film 45 can likewise be provided at the underside 11 of the rigid carrier 12 (with an intervening resin layer 19). It goes without saying that even further layers can be laminated as necessary and depending on the design requirements.

In a next method step, that part of the rigid carrier 12 which corresponds to the cut-out section 14 is cut out. This is carried out e.g. by deep milling. The cutting-out is carried out from the underside 11 of the rigid carrier 12, i.e. from the side facing outward and away from the multilayer construction, as is illustrated by the arrows in the illustration in figure (additionally through the further layers of the copper film 45 and of the resin layer 19 in the case of the embodiment in FIG. 10a).

The cutting-out can be carried out e.g.—as illustrated—along the rear side of the circumferential depression 16. Aiming for the corresponding coordinates can be carried out e.g. by means of reference markings known per se by the person skilled in the art. A process of cutting out along the rear side of the circumferential depression 16 affords the advantage that a small cutting or milling depth can be employed, thereby minimizing the risk of impairment of the internal layer substrate 20, 20'. With sufficiently precise cutting, a cutting process could also be effected elsewhere, or the circumferential depression 16 could also be dispensed with.

FIGS. 11a and 11b illustrate variants of the cutting-out process described. FIG. 11a shows deep milling offset with respect to the depression 16. In the exemplary embodiment illustrated, the offset is chosen to be outward in the direction of the outer edges of the rigid carrier 12, but could also be chosen to be inward. In the exemplary embodiment illustrated, the offset amounts to approximately half of the diameter of the depression (and also of the milling width). The offset produces a cut-out portion having an offset shoulder edge.

FIG. 11b shows, as a further cutting-out variant, oblique cutting out at an angle of less than 90° with respect to a plane of extent of the rigid carrier 12 (while the milling direction in the variants in FIGS. 11 and 11a is substantially perpendicular to the plane of extent of the rigid carrier 12). Inclined cut-out walls can be achieved as a result.

On account of the cavity 24 between the cut-out section 14 and the internal layer substrate 20, 20', the cut-out section 14 that is cut out falls out in a simple manner since it is no longer connected to a surrounding structural part or to a surrounding layer, or it can be removed in a very simple manner (cf. the illustration in FIGS. 11 and 12). As a consequence this gives rise to a cut-out portion 50 in the rigid carrier 12, within which the internal layer substrate is arranged in a partly exposed fashion.

FIG. 12 shows the exemplary embodiment with a substrate 20 with a through hole 34 and furthermore with a blind hole 47 extending from the surface to the interposer or the substrate 20 and serving for through contact-connection. As above in association with the through holes 46 and 48, said blind hole can be introduced, and electroplated, through the entire layer construction after laminating and before cutting out the cut-out section 14.

The exemplary embodiment in FIG. 12 furthermore illustrates a modification of a through hole through the layer construction, namely a through hole 48' that also extends through the substrate 20.

The conductor structural element in FIG. 12 comprises eight conductive layers, namely in each case two copper layers of the electrically conductive layers 12, 18, 42 and 44.

For the purposes of illustrating the possibilities opened up by the invention, FIGS. 13 and 14 illustrate variants having six (FIG. 13) and four (FIG. 14) conductive layers, respectively, in which correspondingly copper-coated layers were replaced by nonconductive layers. In this regard, e.g. in the variant in FIG. 13, the layer surrounding the chip 30 is a nonconductive layer 42', and in the variant in FIG. 14, in addition, the layer surrounding the interposer 20 is a nonconductive layer 18'. In the design of a conductor structural element it is readily apparent to the person skilled in the art which layer sequence is the one suitable for the planned application.

In order to prevent liquid resin from penetrating into the cavity 24 through the substrate through hole 34 (as is provided in the embodiments in FIGS. 12 to 14) during the step of laminating, the plated-through hole can be embodied either as a blind hole (e.g. by means of laser drilling) or as a through hole which is closed again and plated over, if appropriate, during the production of the antenna substrate.

FIGS. 12a, 13a and 14a show the multilayer structures from FIGS. 12, 13 and 14 with further components 52, 54 (e.g. a chip 52 and a capacitor 54) mounted through the cut-out 50 according to the invention. As illustrated, mountings with further components (active and passive components) 36, 38, can also be carried out on the opposite "top side" of the layer construction.

Finally, FIG. 15 illustrates an exemplary embodiment with an antenna 35 formed on the top side (i.e. the side facing away from the cut-out section 14) of the interposer 20". A waveguide 60 is provided for the coupling in of the antenna 35. For the sake of better clarity, the illustration in FIG. 15 dispenses with the illustration of further layers of the conductor structural element, but rather shows only the populated interposer 20" and, in an enlarged manner in the excerpt detail, the waveguide 60 with the antenna 35 arranged thereabove.

The waveguide 60 is formed by a blind hole 62 introduced on the underside 28 of the interposer 20", the inner wall 64 of said blind hole being coated with copper over a defined length or depth (e.g. by electroplating). Above the blind hole 62, the conductive layer of the top side 32 of the interposer or substrate 20" is removed (e.g. by etching), such that the base material 21 of the substrate is exposed (reference sign 33). Above the blind hole 62, the conductive layer of the top side 32 projects as an antenna 35 having a defined length and geometry (this last is not discernible in the side view in FIG. 15) over the blind hole 62 and serves for the emission and/or reception of signals by the waveguide in a manner known per se.

Finally, it should be stated that the diverse variants of conductive and nonconductive layers, deep milled portions, support elements, blind holes, deep holes and through holes, component mountings etc., as illustrated in the figures, can be arbitrarily combined in a manner readily apparent to the person skilled in the art.

The invention claimed is:

1. A method for producing a conductor structural element with a layer construction, comprising the following steps:
   providing a rigid carrier having an outer underside and a top side;
   defining a cut-out section on the rigid carrier;
   applying at least one electrically insulating layer with a recess in such a way that the cut-out section is exposed;
   placing an internal layer substrate above the cut-out section with formation of a cavity between the rigid carrier and the internal layer substrate;
   aligning and fixing the internal layer substrate relative to the rigid carrier;
   laminating the layer construction such that resin material of the at least one electrically insulating layer liquefies and encloses the internal layer substrate with the cavity being left free;
   producing a cut-out by cutting the cut-out section out of the rigid carrier from the outer underside of the rigid carrier.

2. The method as claimed in claim 1, wherein the step of defining the cut-out section comprises introducing a circumferential depression defining the cut-out section on the top side of the rigid carrier.

3. The method as claimed in claim 2, wherein the cutting out is carried out with an offset with respect to the depression.

4. The method as claimed in claim 1, wherein the step of defining the cut-out section comprises applying reference markings.

5. The method as claimed in claim 1, wherein the step of defining the cut-out section comprises applying a circumferential flow barrier against liquefied resin during the laminating.

6. The method as claimed in claim 1, wherein the step of placing the internal layer substrate comprises providing a support element on the top side of the rigid carrier, wherein the support element circumferentially surrounds the cut-out section and serves for supporting the internal layer substrate.

7. The method as claimed in claim 6, wherein the support element also serves for fixing the internal layer substrate relative to the rigid carrier.

8. The method as claimed in claim 6, wherein the support element also serves for providing a flow barrier against liquefied resin during the laminating.

9. The method as claimed in claim 6, wherein the support element is formed by a projecting section of the at least one electrically insulating layer, and the step of fixing is carried out by the action of heat along a boundary of the circumferential depression.

10. The method as claimed in claim 6, wherein the support element is formed by a rapidly curing adhesive.

11. The method as claimed in claim 6, wherein the support element is an element suitable for carrying out an ultrasonic friction welding process, and the step of fixing is carried out by means of an ultrasonic friction welding process.

12. The method as claimed in claim 11, wherein the support element is an Ni—Au-coated element.

13. The method as claimed in claim 1, wherein a further layer laterally surrounding the internal layer substrate is placed before the step of laminating.

14. The method as claimed in claim 1, wherein, before the step of laminating, further layers are applied for completing the layer construction.

15. The method as claimed in claim 1, wherein the cutting out is carried out substantially perpendicularly to a direction of extent of the rigid carrier, or the cutting out is carried out at an angle with respect to a direction of extent of the rigid carrier.

16. The method as claimed in claim 1, wherein after the step of cutting out, further component mounting on the internal layer substrate is carried out through the cut-out.

17. The method as claimed in claim 1, wherein the internal layer substrate is a radio-frequency substrate comprising a radio-frequency-suitable base material.

18. The method as claimed in claim 17, wherein the radio-frequency substrate comprises a component side and an antenna side, and the internal layer substrate is applied with the antenna side facing the rigid carrier.

19. The method as claimed in claim 18, wherein the internal layer substrate is populated with an electronic component on its component side.

20. The method as claimed in claim 18, wherein the internal layer substrate has an antenna structure on its antenna side.

21. A conductor structural element, produced according to a method in claim 1.

22. A conductor structural element, comprising:
an internal layer substrate laminated into a layer construction and having a component side populated with at least one first component and an opposite side facing an edge layer formed by a rigid carrier;
wherein before laminating, by placing the internal layer substrate above an exposed cut-out section of the rigid carrier, a cavity is formed between the rigid carrier and the internal layer substrate, and after the laminating, by cutting the cut-out section out of the rigid carrier from an outer underside of the rigid carrier, an exposed cut-out is formed in the rigid carrier.

23. The conductor structural element as claimed in claim 22, wherein the internal layer substrate, before laminating, is applied to the rigid carrier in a stationary manner by means of a fixing surrounding the cut-out, and the fixing is a barrier against a resin flow enclosing the internal layer substrate during the laminating.

24. The conductor structural element as claimed in claim 22, wherein the opposite side of the internal layer substrate within the cut-out of the rigid carrier is populated with at least one second component.

25. The conductor structural element as claimed in claim 22, wherein the internal layer substrate is a radio-frequency substrate comprising a radio-frequency-suitable base material and having the component side populated with at least one component and an antenna side having a radio-frequency antenna, wherein the radio-frequency antenna is arranged in an exposed manner within the cut-out of the rigid carrier in a manner facing an edge layer formed by the rigid carrier.

26. A conductor structural element, comprising:
an internal layer substrate laminated into a layer construction and having a component side populated with at least one first component and an opposite side facing an edge layer formed by a rigid carrier;
wherein the internal layer substrate is enclosed with resin material as far as an edge region around an exposed cut-out in the rigid carrier.

* * * * *